United States Patent [19]

Dalton

[11] 4,364,025

[45] Dec. 14, 1982

[54] FORMAT SWITCH

[75] Inventor: Christopher J. Dalton, Phoenix, Ariz.

[73] Assignee: Honeywell Information Systems Inc., Phoenix, Ariz.

[21] Appl. No.: 329

[22] Filed: Jan. 2, 1979

[51] Int. Cl.³ .............................................. H03K 13/24
[52] U.S. Cl. ............................ 340/347 DD; 364/900; 364/200
[58] Field of Search ............................. 364/900, 200; 340/347 DD

[56] References Cited

U.S. PATENT DOCUMENTS

3,643,254  2/1972  Proebsting ................. 340/347 DD
4,141,005  2/1979  Bonner ........................ 340/347 DD Primary Examiner—C. D. Miller
Attorney, Agent, or Firm—Edward W. Hughes; Wm. W. Holloway, Jr.; L. J. Marhoefer

[57] ABSTRACT

A multiposition switch is connected to two input data buses which buses can apply binary digital signals of two operands to the switch at one time. An output data bus is also connected to the switch. Depending upon the position of the switch, bits from one or both of the operands as well as bits from other sources are applied by the switch to the output bus so that the format of the operand on the output bus has a predetermined relationship to the operands on the input buses.

15 Claims, 11 Drawing Figures

Fig-2A, Fig-2B, Fig-2C, Fig-2D

FORMAT SWITCH

BACKGROUND OF THE INVENTION

1. Field of the Invention

This invention is in the field of digital data processors, and more particularly relates to apparatus for changing the format of input operands having a fixed number of bits, or lengths, into an output operand of the same length whose format has a predetermined relationship to the format of the input operands.

2. Description of the Prior Art

Digital data processing systems as they evolved have previously had two bases of organization, or operation, determined by the number of bits the processor handles in parallel. Some such systems are optimized to handle a limited number of bits such as those of an alphanumeric character, or a character oriented system. Others are optimized to handle a number of bits generally significantly larger than that needed for processing an alphanumeric character where such groupings of bits are typically called data words, or words. Systems so organized are called word oriented systems and sometimes scientific systems. The minimum number of bits needed to specify alphanumeric character, 26 letters of the alphabet, 10 decimal digits, plus punctuation is six with the present industry standard being eight bits. Such a grouping of eight bits is frequently defined as a byte, as is a grouping of nine bits. It should be noted, however, that only four bits are needed to specify a decimal digit.

Word oriented systems are, however, frequently required to process alphanumeric information. In such a system in which the number of bits in a word is not an even multiple of an eight bit byte, a 36 bit word system for example; this difference creates problems when the system is used to process characters of eight bits and four bits in the execution of application programs, for example.

In such a word system it is desirable to take maximum advantage of the full capabilities of the system to process the large number of bits of a word in parallel while avoiding the necessity of rewriting application programs designed originally to run on byte, or character, oriented data processing systems. Typically, application programs for processing alphanumeric data are programs for preparing payrolls, controlling inventory and the like. A particular problem occurs with respect to processing decimal characters in a word oriented machine since in order to process the decimal characters efficiently, it is desirable to place up to eight decimal characters in one word, for example, so that two such words can be processed, added, multiplied, etc. in parallel. The format of an operand with eight four bit decimal characters is named a compressed format with the characters contiguous to one another and eight right or left justified in a 36 bit word. It is also necessary to reformat words in the compressed format into formats which are better adapted for storage and retrieval, two such formats are called a packed format and an unpacked format. An operand having two decimal characters in each nine bit byte of a 36 bit word is defined as being a packed format. An operand is in the unpacked format when only one decimal character of four bits is placed in each nine bit byte of a 36 bit word. The packed and unpacked formats are desirable to make efficient use of the data storage capabilities of the memories of word oriented systems which are also organized by data words, and particularly so when there is a need to address a given decimal digit in a byte as is necessary from time to time.

To date, no hardware solution has been developed to reliably change the formats of operands containing decimal characters in a word oriented data processing system within a minimum period of time for subsequent processing, storage and display.

SUMMARY OF THE INVENTION

The present invention provides circuit means in a central processor of the digital data processing system to which circuit means are applied two input operands. The circuit means converts the formats of the applied operands into an output operand having a format having a predetermined relationship to the formats of the input operands appropriate for subsequent processing, storage or display.

It is therefore an object of this invention to provide apparatus in a digital data processing system for efficiently changing the format of operands.

It is another object of this invention to provide a multicondition circuit in a synchronous digital data processing system for changing input operands containing decimal characters in one format into an operand having a format which has a predetermined relationship to the input operands as a function of the condition of the circuit.

It is yet another object of this invention to provide a synchronous digital data processing system with the capability of producing within a single clock period an output operand whose format has a predetermined relationship to input operands.

BRIEF DESCRIPTION OF THE DRAWINGS

Other objects, features and advantages of the invention will be readily apparent from the following description of certain preferred embodiments thereof, taken in conjunction with the accompanying drawings although variations and modifications may be effected without departing from the spirit and scope of the novel concepts of the disclosure, and in which:

FIGS. 2 A–H illustrate the formats of operands applied to the format switch of this invention and the formats of the operands produced by the switch for each position of the format switch.

DESCRIPTION OF THE PREFERRED EMBODIMENT

Figure 1:
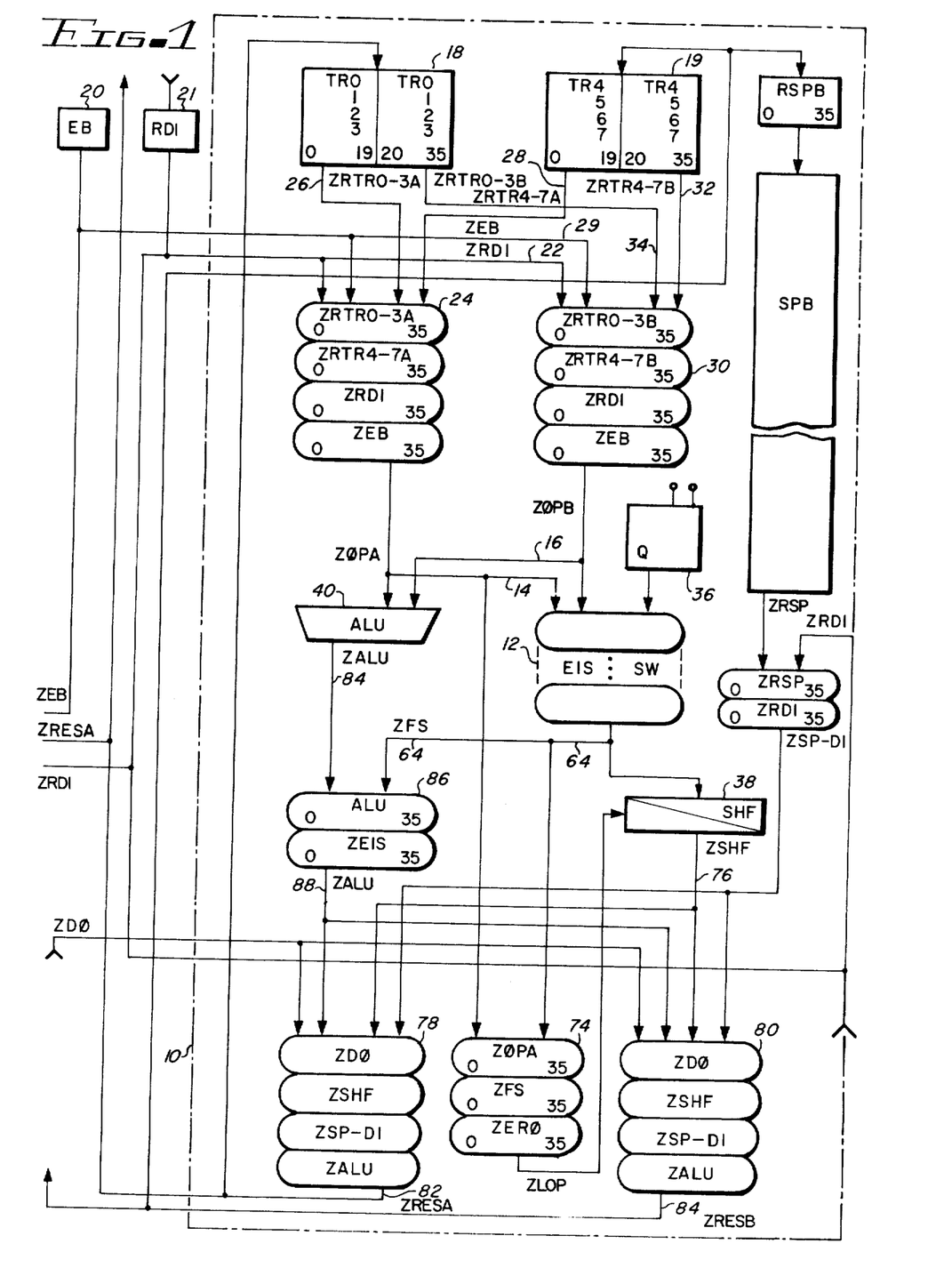
FIG. 1 is a block diagram of a portion of a central processing unit of a digital data processing system in which the format switch of this invention is incorporated.

In FIG. 1, execution unit 10 of a typical central processor of a digital data processing system is illustrated. Format switch 12 is a one of eight select switch in the preferred embodiment, which is connected to A operand bus 14, Z$\phi$PA and B operand bus 16, Z$\phi$PB. Buses 14, 16 each have 36 conductors in the preferred embodiment. Each conductor of each bus, such as buses 14, 16 and the other buses illustrated in FIG. 1, is adapted to conduct or carry a binary digital signal, hereafter sometimes referred to as a logic signal or as a bit. The 36 bits on bus 14 are also sometimes referred to as the A operand where an operand is a unit of data. The arrangement, or order, of the bits of a data word, or operand is its format.

Figure 4:
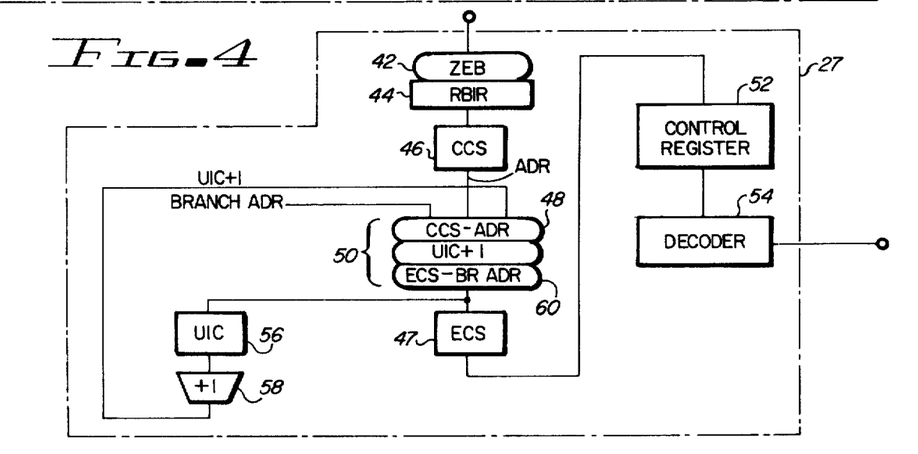
FIG. 4 is a schematic block diagram of a source of control signals for a central processing unit.

The sources of the signals for the A and B operands on buses 14, 16 can be operands stored in temporary storage registers 18, TR 0-3; temporary registers 19, TR 4-7; execution buffer 20, EB; and data in register 21, RDI. The contents of one of temporary registers 18, such as TR 0 for example, is applied to one of four select A operand switch 24, by bus 26, ZRTR 0-3A, by the application of appropriate control signals to temporary register 18 from a conventional source 27, which is illustrated in FIG. 4. The control lines connecting source 27 to the registers, switches, etc. of execution unit 10, since they are conventional and well known in the art, are not illustrated in FIG. 1 to avoid making FIG. 1 excessively complex. If A operand switch 24 has appropriate control signals applied to it from controller 27 while signals of the operand stored in register TR 0 are present on bus 26, the signals of bus 26 will be applied to A operand bus 14. Other sets of control signals applied to switch 24 will result in the signals on bus 28, ZRTR 4-7A; bus 29, ZEB; or on bus 22, ZRDI being applied to A operand bus 14. In a similar manner, one of four select B operand switch 30 can select signals on buses 22; 29; 32, ZRTR 4-7B; or 34, ZRTR 0-3B and apply them to B operand bus 16. In addition to the A and B operand buses 14 and 16, switch 12 also has applied to it the output signals of zone flip flop 36.

Source of control signals, or controller 27 for controlling the switches and registers of FIG. 1, conventional shifter 38, and arithmetic and logic unit 40, ALU, is illustrated in FIG. 4. An instruction word stored in execution buffer 20, which is illustrated in FIG. 1, is transmitted through execution buffer switch 42, ZEB, to register 44, RBIR, for storage therein. The operation code, of the instruction word in register 44, bit locations 18-27, in a preferred example, is the address in control unit control store 46, CCS, of a control unit control word. The control unit control store word in CCS 46 at said address has a 13 bit address field, which address is the address of the starting location of the microprogram to implement the operation specified by the operation code of the instruction word in instruction register 44. As the result of the operation code from an instruction word being applied to CCS 46 from instruction register 44, the address field of the control unit control word stored at the address corresponding to the operation code will be applied to the execution control store (ECS) 46 through switch position 48, CCS-ADR, of 1 of 3 select switch 50. The receipt of an address of a microinstruction by ECS 46 causes the microinstruction stored at that address to be transferred to microinstruction control register 52 where selected fields are decoded by decoder 54 to provide the necessary control signals to the various subsystems, or components of execution unit 10, for example. Since in the preferred embodiment execution unit 10 is a part of synchronous system all functions are synchronized by clock pulses as is well known in the art. To avoid providing unnecessary details, the clock and the conductors to apply the clock signals to the various components of execution unit 10 are not illustrated since they are conventional and well known in the art.

When the first microinstruction of a microprogram is placed in control register 52, the address of the first microinstruction is also stored in instruction control register 56. During the next clock period the address in register 56 is incremented by 1 by counter 58 to produce the address of the next microinstruction of the microprogram and the address is applied to ECS 47 by gate position 60, UIC +1, of gate 50 being enabled. The address applied to ECS 46 through gate position 60 causes the ECS to apply the second microinstruction of the microprogram in execution to control register 54 and decoder 54 during subsequent clock periods. This process is continued until all microinstructions of the microprogram have been executed. For additional details of the operation of controller 27 reference is made to Application Ser. No. 746,444 filed Dec. 1, 1976 by Richard T. Flynn, which Application is assigned to the assignee of this Application. Conventional hard wired sources of control signals could be substituted for controller 27 as is well known in the data processing art.

Figure 2A:
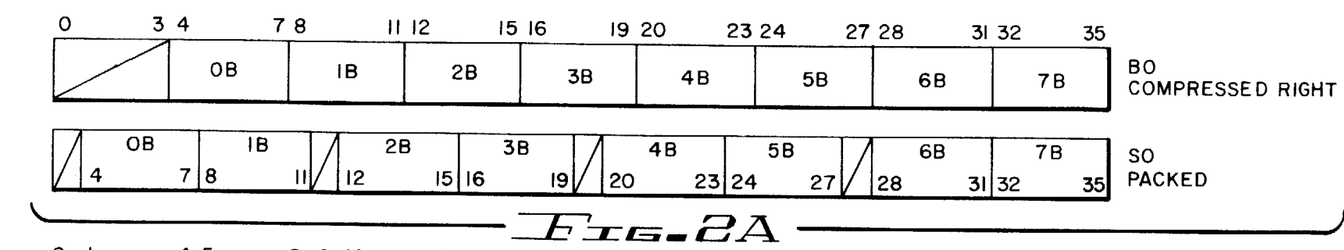

Format switch 12, in the preferred embodiment, is a 1 of 8 gated select switch which is connected to A and B operand buses 14 and 16 and other sources of logic signals to cause certain transformations to occur to the bits of operands present on buses 14 and 16 so that the format of the output operand of switch 12 has a predetermined relationship to the input operands. In the preferred embodiment, each character of the A and B operands is a four bit decimal character such as characters 0–7B of operand B0 of FIG. 2A. The bit positions in the operands with a line slanting diagonally to the right such as bit positions 0–3 of operand B0 of FIG. 2A are fill bits, which have, in the preferred embodiment, an arbitrary binary value assigned to them of 0. The format of the operand B0 of FIG. 2A is defined as being compressed right; i.e., characters 0–7B each of four bits are right justified with fill bits in bit positions 0–3.

When switch 12 has applied to it three control, or gate select, signals having the values of 0,0,0 or zero, switch 12 will be in its first position, or condition. When switch 2 is in the first position, it will select certain signals of the operand on bus ZϕPB 16, the B operand, such as operand B0, and apply them to format switch but 64, ZFS. The output operand S0 of format switch 12 on bus 64 will have the format illustrated in FIG. 2A. The format of operand S0 in FIG. 2A is defined as "packed" with two decimal characters each of four bits, and a fill bit in the highest order bit position in each 9 bit byte of operand S0.

When appropriate gate select control signals are applied to switch 12, having the values of 0, 0, 1, switch 12 is placed in its second position, or condition. When switch 12 is in its second position operand B1 on ZϕPB 16 in FIG. 2B will be translated, or reformatted, and appear as output operand S1 on bus 64 and will have the format illustrated in FIG. 2B. Switch 12 when in its second position converts decimal characters 0–7B of operand B1 which are in the packed format to the compressed right format.

Figure 2B:
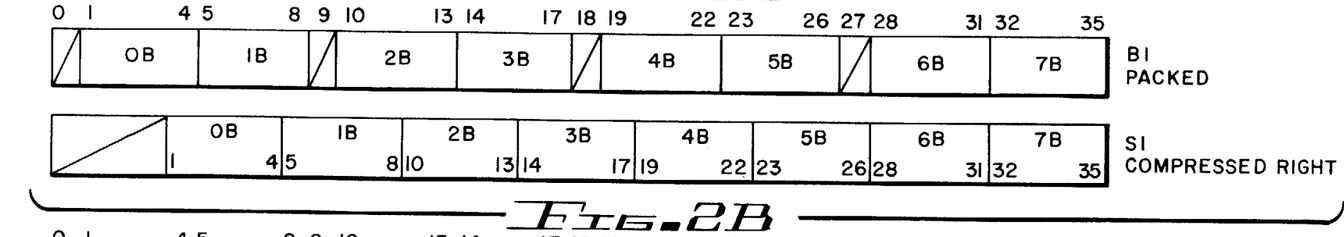
Figure 2C:
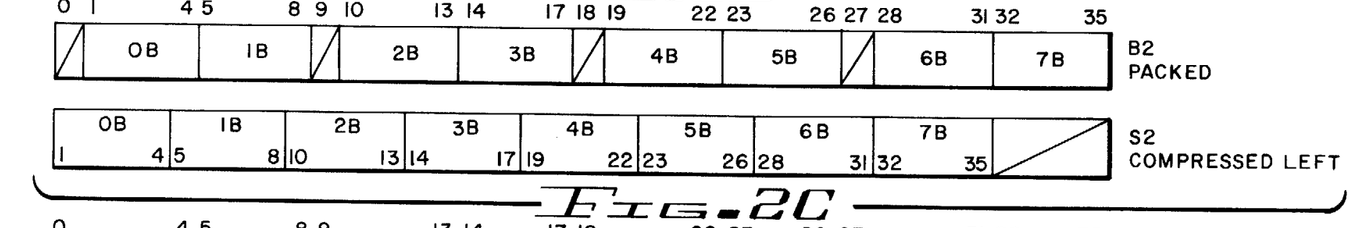

When switch 12 is placed in its third position by appropriate control signals from controller 27 operand B2 on ZϕPB 16 which has a packed format as illustrated in FIG. 2C is converted by switch 12 to output operand S2 having the format illustrated in FIG. 2C. The format of output operand S2 is defined as being compressed left. It should be noted that the decimal characters 0–7B of operand B2 are placed adjacent to, or contiguous to one another, and in order. Since switch output operand S2 is left justified, fill characters are placed in bit positions 32–35.

Figure 2D:
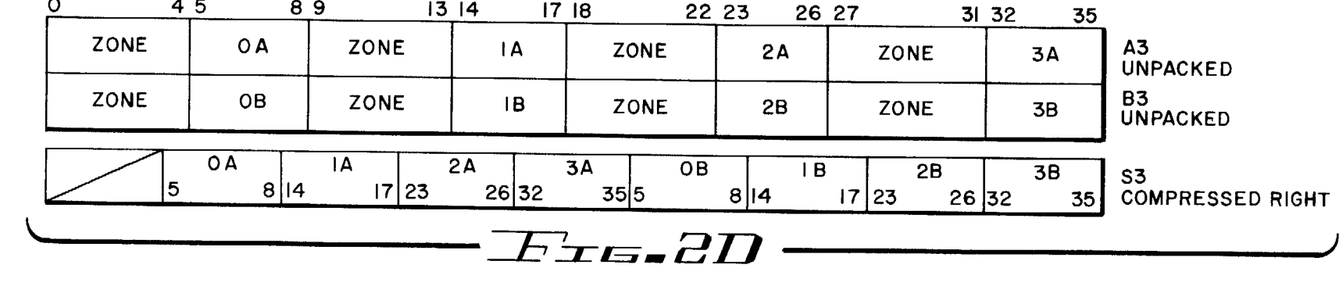

When switch 12 is placed in its fourth condition characters from A and B operands on buses 14, 16, operands A3 and B3, are reformatted into switch output operand S3. The formats of operands A3, B3 in FIG. 2D are defined as being "unpacked", i.e., one decimal character of four bits is located in each byte of 9 bits, with the four bits of a decimal character occupying the lower order bit positions of a byte and five zone bits occupying the higher order bit positions. For example, in FIG. 2D, the byte comprising bit positions 0–8 of A operand A3 has the decimal character 0A in bit position 5–8. The zone bits in bit locations 0–4, for example, are used to identify the particular code of decimal character 0A, which is either EBCDIC or ASCII. The zone bits will have the values 00110 if character 0A of operand A3 is in ASCII code and 01111 if it is in EBCDIC in the preferred embodiment. The format of the output operand S3 of FIG. 2D is denoted as being compressed right.

Figure 2E:
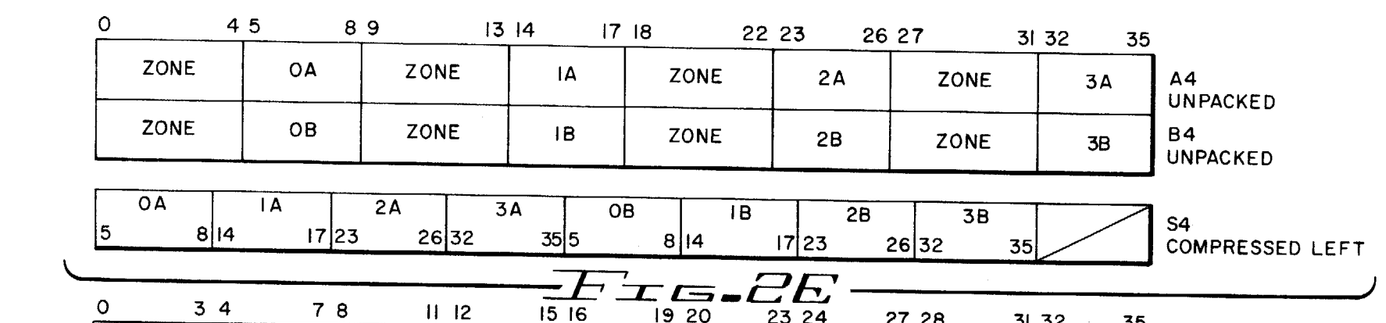

When switch 12 is placed in its fifth condition, or position by appropriate gate select control signals, operands A4, B4 have the unpacked format of the operands illustrated in FIG. 2E. The format of switch output operand S4 is denoted as being compressed left, or left justified, with the four decimal characters 0–3A and 0–3B from operands A4 and B4 in the order illustrated with fill bits in bit positions 32–35.

Figure 2F:
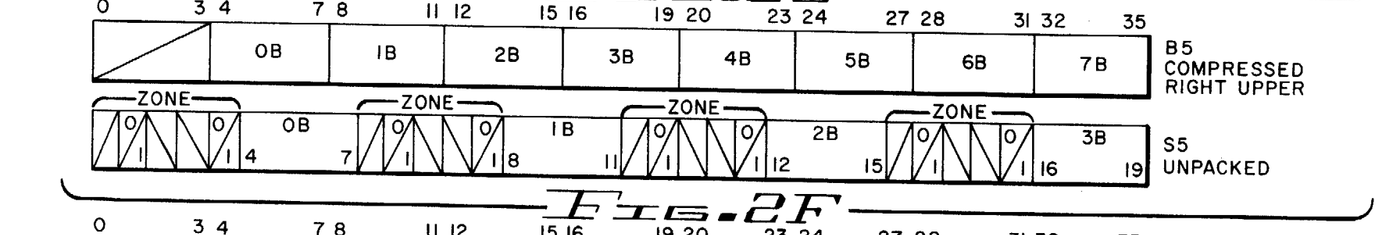

When it is desired to change a B operand in the compressed right format such as operand B5 in FIG. 2F which has or contains eight decimal characters to the unpacked format and since an operand in the unpacked format contains only four decimal characters, it is necessary to specify which four are to be included in the output operand. When switch 12 is placed in its sixth position, switch 12 takes the upper, or higher order, characters 0–3B of operand B5 and places them on switch output bus 64 so that characters 0–3B are positioned in operand S5 as illustrated in FIG. 2F. Depending upon whether the characters 0–3B are ASCII or EBCDIC, and it is given that all characters of a given operand will all be one or the other, the five bit positions of each zone of each 9 bit byte is loaded with bits having the format 00110 if ASCII or 01111 if EBCDIC. In the identification codes for the zones only bit positions one and four change and bits 1 and 4 always have the same value. The values for bits 1 and 4 of each zone are determined by zone flip flop 36 which is set or reset by control signals from the source of control signals 27. For example, flip flop 36 could be set if the character of switch output operand S5 is EBCDIC so that bit positions 1 and 4 of each zone each will be a logical 1 and reset if the characters are ASCII so that the bit positions 1 and 4 of each zone would be logical 0s.

Figure 2G:
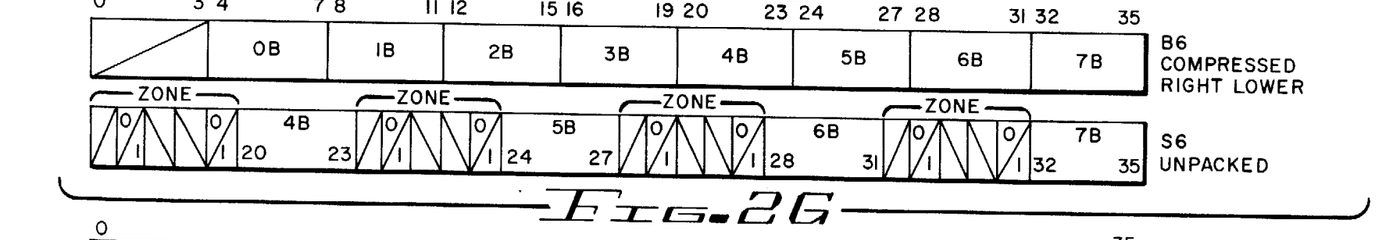
Figure 2H:
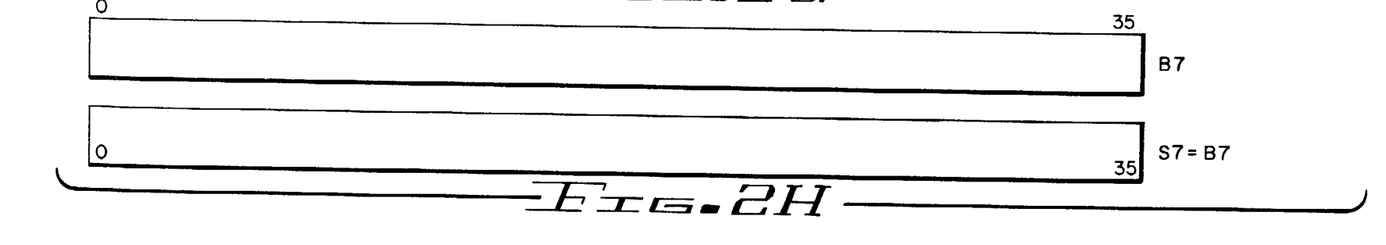

To place decimal characters 4–7B of operand B6 of FIG. 2G, whose upper four characters 0–3B may have been reformated into an unpacked format by placing switch 12 in its sixth position, switch 12 is placed in its 7th position. Input operand B6 is frequently the same operand as was applied to switch 12 when switch 12 was in its sixth position or condition. When switch 12 is in its sixth condition, characters 4–7B of the input operand B6 will appear as illustrated in switch output operand S6 of FIG. 2G which has an unpacked format.

When switch 12 is placed in its eighth condition, input operand B7 is applied to switch output bus 64 without change so that switch output operand S7 is the same as operand B7 on input bus ZφPB 16.

Figure 3:
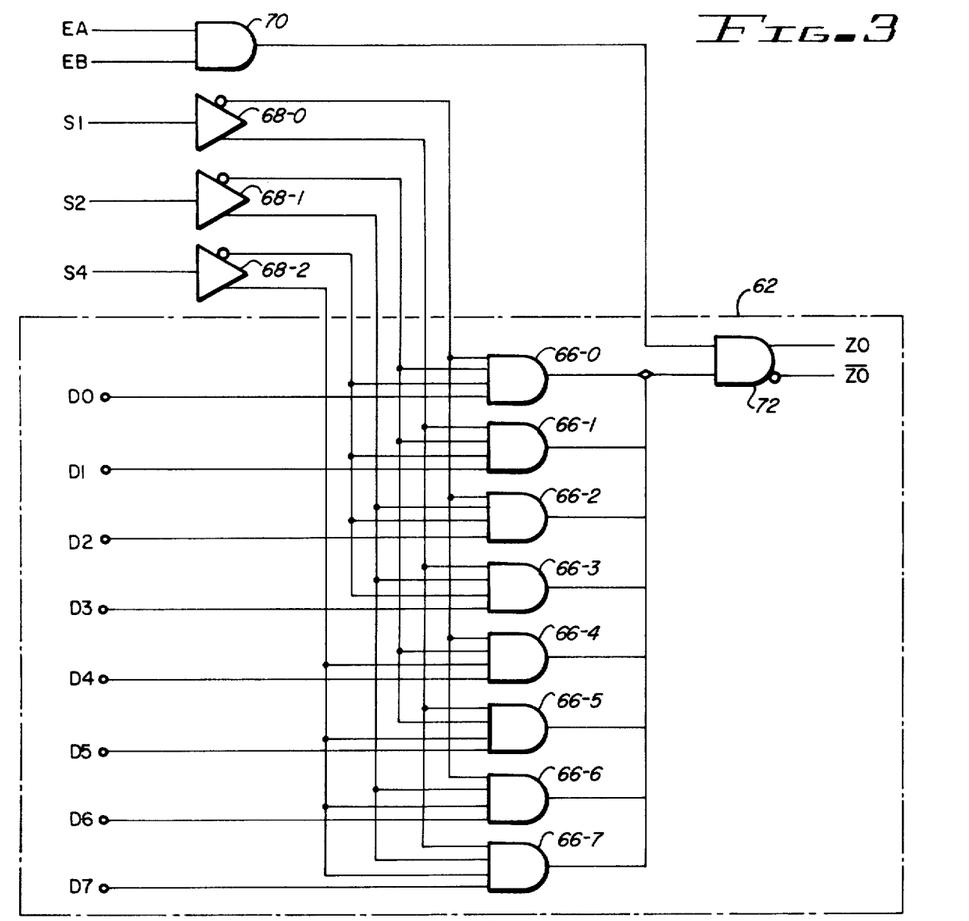
FIG. 3 is a logic diagram of a portion of a one of eight gated select switch.

FIG. 3 is a block diagram of a 1 of 8 gated select switching unit, or switch, 62 that selects which one of eight logic signals applied to its input terminals D0–7 will be connected to and appear at its output terminal ZO. Terminal ZO is then connected to one conductor of switch output bus 64. Since the operands in the preferred embodiment have 36 bits, switch 12 is comprised of 36 switching units 62. Unit 62 is provided with eight 4 input And-gates 66 0–7. Which of And-gates 66 0–7 will be enabled is determined by gate select control signals S1, S2, S4 from controller 27 which signals are applied respectively to conventional amplifier, or buffer, circuits 68 0–2. Amplifiers 68 0–2 produce as their output signals, control signals, S1, S2, S4 and $\overline{S1}$, $\overline{S2}$ and $\overline{S4}$. Control signals $\overline{S1}$, $\overline{S2}$ and $\overline{S4}$ and their complements S1, S2 and S4 are applied to three of the input terminals of each of the four input And-gates 66 0–7 so that one and only one of the gates 66 0–7 will be selected or enabled at one time. Which one of And-gates 66 0–7 is enabled is determined by the binary values of S1, S2 and S4 at any given moment. The other input terminal of each of And-gates 66 0–7 is connected respectively to one of input terminals D 0–7, to which input terminals are applied logic signals, or bits, on B operand bus 16, on A operand bus 14, from zone flip flop 36, or any other sources of logical 1s or logical 0s such as ground for logical 0 or the power supply of execution unit 10 for logical 1.

In addition to gate select control signals S1, S2, S4 applied to amplifier circuits 68 0–2; enable logic signals EA and EB are applied to enable gate 70, and the output signal of enable gate 70 is applied to an input terminal of output gate 72. Gates 70, 72 are in a preferred embodiment two input terminal And-gates. Gate 72 produces as its output ZO and its inverted or complemented output $\overline{ZO}$. Depending on the values of S1, S2, S4 and if the enable signals EA and EB are present, then the signal applied to the selected one of input terminals D 0–7 of unit 62 will be present, or appear, at output terminal ZO.

In FIGS. 2 A–H, each bit of the A and B operands is numbered from 0–35. The output operands S of format switch 12 include numbers to identify the source of the bits in the input operands A or B where such is the case. Each character in each input operand is given a letter A, or B to designate the input operand from which the character comes. For example, referring to FIG. 2A, the bits defining decimal character OB are in bit locations 4, 5, 6 and 7 of operand B0; and the four bits of character 7B of operand B0 are in bit locations 32, 33, 34 and 35. To convert the format of operand B0 to that of the format of operand S0, bit position 0 of operand S0 is connected to ground, which is denoted by the diagonal line through bit location 0. Bit location 1 of operand S0 is connected to the conductor of bus 16 on which the bit of location 4 of operand B0 is present. Bit location 2 of operand S0 is connected to the conductor of bus 16 corresponding to bit location 5 of operand B0; etc.

In FIG. 2F, bit locations 1 and 4 of switch operand S5 is connected to the Q output terminal of zone flip flop 56 so that if flip flop 36 is set or reset, the second and fifth bits of the zone signals of each zone will be 1s or 0s as determined by the state of flip flop 36. If any bit position of a output operand S of format switch 12 were always a logical 1, such as bit positions 2, 3 of operand S5, for example, then the input terminal of the switching unit for that location and that condition would be connected to the power supply of the switching unit. In the convection used in FIGS. 2 A-H a bit position with a diagonal line slanting to the left is always a logical 1.

From the information available in FIGS. 2 A-H it is believed readily apparent to one skilled in the art how to connect each conductor of the A and B operand buses 14 and 16 to the input terminals of each of the 36 one of 8 switching units 62 that make up the preferred embodiment of format switch 12 to produce output operands on bus 64 having the desired format. However, as an example, if switching unit 62 illustrated in FIG. 3 produces at its output terminal ZO the highest order bit of the output operand of format switch 12 on switch output bus 64, and if switch 12 is in its 0 position, or condition, signals S1, S2 and S4 will all be logical zeroes, and input terminal DO will be connected to ground. When the switch 12 is put into second condition signals S1, S2 and S4 have the values of 1, 0, 0 and the terminal D1 of switching unit 62 would also be ground. When switch 12 is placed in its third condition, signals S1, S2 and S4 have the values of 0, 1, 0 respectively and input terminal D2 of switching unit 62 would be connected to the conductor 1 of the B operand bus 16. When switch 12 is placed in its 4th position, signals S1, S2 and S4 have the value of 1, 1, 0 and input terminal D3 of unit 62 would be connected to ground. When the switch 12 is placed in its 5th condition, signals S1, S2 and S4 have the values 0, 0, 1 and input terminal D4 of unit 62 would be connected to the conductor of A operand bus 14 corresponding to bit location 5 of operand A4. When switch 12 is placed in its 6th position, signals S1, S2 and S4 have the values 1, 0, 1 and input terminal D5 of unit 62 would again be connected to ground. When switch 12 is placed in its 7th position, signals S1, S2 and S4 have the values 0, 1, 1 input terminal D6 of unit 62 would again be connected to ground. When the switch 12 is placed in its 8th position, signals S1, S2 and S4 would have the value 1, 1, 1 and input terminal D7 of unit 62 would be connected to the conductor of B operand bus 16 on which the binary digital signal for the 0 bit position of the B operand signal is present.

In operation under the control of the programmer who writes the microprograms stored in execution unit 46 of controller 27, an operand of a given format such as the packed format of operand B1 of FIG. 2B is to be changed to the compressed right format of switch output operand S1. The operand B1 can be stored in any of the temporary registers 18; 19; in execution buffer, or register 20; or data in register 21. On the next clock signal, control signals from controller 27 will apply operand B1 to one of the buses 22, 29, 32, 34 depending on which register the operand B1 is stored in. If operand B1 were stored in temporary register TR-O of register bank 18, operand B1 will be connected to or applied to bus 34, and switch position ZRTR 0-3B of B operand switch 30 will be selected to apply operand B1 to B operand bus 16. At the same time control signals will be applied to format switch 12 to select its first position which will result in the format of operand B1 being changed to that of operand S1 on switch output bus 64.

Output operand S1 on bus 64 is applied directly to shifter 38 as the right input operand, and it can also be applied through switch 74 as the left input operand ZLOP to shifter 38. The output of shifter 38 is a 36 bit operand on shifter output bus 76, ZSHF. The composition of the operand on bus 76 depends on the control signals applied to shifter 38 by controller 27.

The output operand of shifter 76 is applied to 1 of 4 select result A switch 78 and to 1 of 4 select result B switch 80. By appropriate control signals applied to switches 78, 80 from controller 27, the operand bus 76 can be applied to result A bus 82, ZRESA, or to result B bus 84, ZRESB. The shifter output operand can then be stored in one of the registers of temporary register banks 18, if present on bus 82, or in one of the registers of register bank 19 if present on bus 84 or transferred to other subsystems of the computer system.

After being stored in register TRO for example, the shifter output operand could be applied to ALU 40 as either the A or B input operand. The output of ALU 40 is applied to 1 of 2 select switch 86 as is the output of format switch 12. Switch 86 selects in accordance with control signals applied to it by controller 27 which one of the two operands applied to it will be applied to bus ZALU 88 which is connected to result A and B switches 78, 80. Thus by appropriate control signals applied to the registers, switches, shifter 38 and ALU 40 the result of the operation of shifter 38 and ALU 40 on such operands can be reformatted to facilitate storage or display for example.

From the foregoing it is believed obvious that this invention provides fast, efficient and reliable circuits for changing the formats of decimal characters for subsequent processing and for changing the formats of operands after such processing to a format optimized for display, storage or subsequent processing with the result that word oriented data processing system can handle efficiently application programs which require processing data organized into characters.

While the principles of the invention have now been made clear in any illustrative preferred embodiment, there will be many obvious modifications of the circuits and components which can be made without departing from that principle. The appended claims are intended to convey any such modifications.

What is claimed is:

1. In combination:
    an A input operand bus adapted to carry binary signals of an A operand of n bits, where n is an integer other than zero;
    a B input operand bus adapted to carry the binary signals of a B operand of n bits;
    an output operand bus adapted to carry binary signals on an output operand of n bits, said A, B and output operands each having a format;
    circuit means having p conditions, where p is an integer other than zero, said circuit means connected to the input operand buses and the output operand bus, said circuit means applying to the output operand bus an output operand, the format of which has a predetermined relationship to the format of the input operands as a function of the condition of the circuit means at any given time; and
    control means for applying control signals to the circuit means to determine the condition of the circuit means at any given time.

2. The combination of claim 1 in which $n=36$ and $p=8$.

3. In combination:
    a first input operand bus adapted to carry binary signals of a first operand of n bits, where n is an integer other than zero;
    a second input operand bus adapted to carry the binary signals of a second operand of n bits;

an output operand bus adapted to carry binary signals on an output operand of n bits, said first, second and output operands each having a format;

a one of p condition switch where p is an integer, said switch having p×n input terminals and n output terminals, the input terminals of the switch being connected to the input operand buses and the output terminals being connected to the output operand bus, said switch applying to the output operand bus the binary signals of an output operand, the format of the output operand having a predetermined relationship to the formats of the input operands as a function of the condition of the switch at any given time; and control means for applying control signals to the circuit means to determine the condition of the circuit means at any given time.

4. The combination of claim 3 in which n equals 36 and p=8.

5. Circuit means for reformatting operands comprising: an A input operand having n conductors and adapted to carry the binary signals of an A operand of n bits, where n is an integer other than 0;

a B input operand bus having n conductors and adapted to carry the binary signals of a B operand of n bits;

an output operand having n conductors and adapted to carry the binary signals of an output operand having n bits, said A, B and output operands each having a format;

means for producing binary signals;

a controller for producing binary control signals gated switch means having input terminals and n output terminals said input terminals being connected to the conductors of the A and B input buses and to the means for producing binary signals; said switch means being connected to the controller; said switch means having p conditions; said switch means, in response to control signals from the controller, being placed in one of its p conditions; said switch means when in one of its conditions gating predetermined ones of the binary signals connected to its input terminals to its output terminals, so that the format of the output operand on the output bus has a predetermined relationship to the format of the A and B operands, said relationship being different for each of the p conditions of the switch.

6. The circuit means of claim 5 in which n=36 and p=8.

7. The circuit means of claim 5 in which the means for producing binary signals includes a zone flip flop whose state is determined by control signals from the controller.

8. The circuit means of claim 5 in which the number of input terminals of the gated switch means equals (n×p).

9. A circuit for reformatting operands comprising:
an A input operand bus having n conductors, and adapted to carry the binary signals of an A operand of n bits, where n is an integer other than zero;

a B input operand bus having n conductors and adapted to carry the binary signals of a B operand of n bits;

an output operand bus having n conductors and adapted to carry the binary signals of an operand of n bits, said A, B, and output operands each having a format;

a source of binary signals;

n switching units, each switching unit having p conditions, where p is an integer other than zero, each switching unit having p input terminals and an output terminal, the output terminal of each switching unit being connected to one of the conductors of the output operand bus, the input terminals of each unit being connected to the conductors of the A input bus, the B input bus, or the source of binary signals, the connections being such that for each condition of a switching unit the binary signal at one of the input terminals of said unit is present at that units output terminal and so that the format of the output operand on the output operand bus has a predetermined relationship to the A and B operands; and control means connected to the switching units for placing each of said switching units in one of its conditions at any given period of time.

10. The circuit of claim 9 in which n=36 and p=8.

11. The circuit of claim 7 in which the source of binary signals includes a flip flop having two states, said flip flop being connected to the control means, and the state of the flip flop being determined by the control means.

12. Circuit means for reformatting operands comprising:

an A input operand bus having n conductors and adapted to carry the binary signals of an A operand of n bits, where n is an integer other than zero;

a B input operand bus having n conductors and adapted to carry the binary signals of a B operand of n bits;

an output operand having n conductors and adapted to carry the binary signals of an output operand having n bits, said A, B and output operands each having a format;

means for producing binary signals;

a source of control signals;

format switch means connected to the A and B operand input buses, the means for producing binary signals, and the source of control signals; said format switch having p conditions, where p is an integer other than 0; said switch means being placed in each of its p conditions by control signals from the source of control signals;

said format switch means when placed in one condition by control signals converting one input operand having a compressed right format to an output operand having a packed format;

said format switch means when placed in another condition by control signals converting one input operand in a packed format to an output operand in a compressed right format;

said format switch means when placed in yet another condition by control signals converting an input operand having a packed format to an output operand having a compressed left format;

said format switch means when placed in still another condition by control signals from the source of control signals converting the format of both input operands each having an unpacked format to an output operand in the compressed right format;

said format switch means when placed in an additional condition by control signals from the source of control signals converting both input operands in the unpacked format to an output operand in the compressed left format;

said format switch means when placed in still another condition by control signals from the source of control signals converting a part of one input operand in the compressed right format into an output operand having an unpacked format;

said format switch means when placed in a further condition by control signals from the control source converting another part of one of the input operands in the compressed right format, into an output operand having an unpacked format; and said format switch means when placed in a still further condition connecting one input operand without change of format.

13. The circuit means of claim 12 in which $n=36$.

14. The circuit means of claim 13 in which $p=8$.

15. The circuit means of claim 12 in which the means for producing binary signals is a zone flip flop connected to the source of control signals, the state of the flip flop being determined by control signals from the source of control signals.

* * * * *